United States Patent [19]
Wolski et al.
[11] 3,918,926
[45] Nov. 11, 1975

[54] PLURAL COPPER-LAYER TREATMENT OF COPPER FOIL AND ARTICLE MADE THEREBY

[75] Inventors: Adam M. Wolski; Charles B. Yates, both of Edgewater Park, N.J.
[73] Assignee: Yates Industries, Inc., Bordentown, N.J.
[22] Filed: Oct. 8, 1971
[21] Appl. No.: 187,923

[52] U.S. Cl. .................... 29/195; 29/199; 156/151; 204/40; 204/44
[51] Int. Cl.$^2$ .... B23P 3/00; C25D 3/58; C25D 5/10
[58] Field of Search .. 29/199, 195 E, 195 N, 195 P, 29/195 T, 195 G, 183.5; 204/40, 43, 44; 156/151

[56] References Cited

UNITED STATES PATENTS 2,135,873 11/1938 Jones et al. .................... 204/40 X
2,802,897 8/1957 Hurd et al. .................... 29/195 X
3,220,897 11/1965 Conley et al. .................... 156/151 X
3,293,109 12/1966 Luce et al. .................... 156/151 X

*Primary Examiner*—G. L. Kaplan
*Attorney, Agent, or Firm*—Lane, Aitken, Dunner & Ziems

[57] ABSTRACT

Copper foil is subjected to a two-step electrochemical copper treatment to improve its bond strength, the first step of said treatment involving the use of a copper and arsenic-containing electrolyte. A treatment involving the use of the aforementioned two-step electrochemical copper pretreatment prior to the application of an electrochemical copper treatment. Treated copper foil and printed circuit boards resulting therefrom.

24 Claims, No Drawings

PLURAL COPPER-LAYER TREATMENT OF COPPER FOIL AND ARTICLE MADE THEREBY

BACKGROUND OF THE INVENTION

The present invention relates to improved treatment operations for the treatment of copper foil.

In the production of printed electronic circuits, it is a common practice to bond metal foil to a substrate material, generally a synthetic polymer, and to subject the composite structure to acid etching to form the desired circuit. Since the adhesive foil often serves as the mechanical support of the circuit elements as well as serving as the conductor paths, considerable effort has been directed in the past to treating the foil so as to increase its bond strength with respect to the substrate to which it is to be attached. As a result of such efforts, treatments have been developed which serve to increase the surface area of the matte surface on a side of the copper foil through the deposition of a dendritic copper electrodeposit so that when adhesively bonded to a plastic substrate material, a tenacious bond will result.

In order to obtain the maximum increase in bond strength from a given treatment, it has been not uncommon to increase the amount of copper deposited on the copper foil. While such increase permits the achievement of enhanced bond strength, however, it has simultaneously served to create significant powder and oxide transfer problems. While these problems are avoided through a decrease in the thickness of the copper electrodeposit on the foil, the necessary consequence of such decrease has been an undesirable loss in bond strength.

SUMMARY OF THE INVENTION

One embodiment of the present invention is directed to a treatment process which provides copper foil which not only possesses extraordinarily high bond strength but which is not characterized by the powder and oxide transfer problems noted above. This process involves subjecting copper foil to a two-step electrochemical pretreatment prior to the application of an electrochemical treatment, the first step of said pretreatment involving the use of an arsenic and copper-containing electrolyte to form a first copper layer which increases the bond strength of the raw foil, the second step of the pretreatment involving the use of a copper-containing electrolyte to electrodeposit a second, gilding copper layer which substantially conforms to the configuration of the first layer so as to reduce the powder transfer characteristics of the first layer, the final electrochemical treatment involving the use of a metallic ion-containing electrolyte under conditions such as to electrolytically deposit a third, microcrystalline layer which further increases the bond strength of said foil.

A second embodiment of the present invention is directed to a two-step electrochemical copper treatment which involves subjecting copper foil to the aforementioned two-steps as the total treatment.

OBJECTS AND ADVANTAGES OF THE INVENTION

It is accordingly an object of the present invention to provide a novel method and articles made therefrom for providing foil with excellent bond strength making it particularly well adapted for use in printed electronic circuit applications.

These and other objects and advantages of the present invention will become more apparent in connection with the ensuing description and appended claims.

DETAILED DESCRIPTION OF THE PREFERRED EMBODIMENTS

In accordance with one embodiment of the present invention, copper foil is first subjected to a two-step pretreatment to prepare it for and improve the effectiveness of the final electrochemical treatment. In the first pretreatment step, conditions are selected so as to provide the surface of the foil which is to be bonded to a supporting substrate with a copper and arsenic-containing electrodeposit which will increase the bond strength of the raw foil from about 5–6½ lbs./in. of width of laminate to about 9½–10 lbs./in. of width of laminate.[1] The copper electrodeposit resulting from this first pretreatment step roughens the surface of the foil but is structurally less sound than would be desirable in treated foil destined for printed circuit applications. In order to improve the structural characteristics of the foil, a second pretreatment step is employed to apply a "locking" or "gilding" copper electrodeposit on the first electrodeposit resulting from the first pretreatment step. This second electrodeposit does not substantially interfere with the bond strength resulting from the first pretreatment step (the resulting bond strength is in the order of 9–10 lbs./in. of width) while reducing or eliminating the disadvantageous powder transfer characteristics which the foil otherwise would have as a result of the first pretreatment step.

[1]Bond strength is measured as follows: The foil is bonded to an epoxy resin-impregnated fiberglass support in a conventional manner. The epoxy resin is used in its "B" stage and is cured in contact with the treated surface of the foil under a pressure of about 500 psi at about 330°–340° F. The final thickness of the laminate is approximately 1/16th of an inch with the foil comprising about 0.0015 inches of this total. The laminate so constructed is then cut into ½ inch wide strips and subjected to bond strength tests in the following manner: Copper is peeled from the glass cloth support at a rate of 2 inches per minute in a direction perpendicular to the laminate. The force required to peel the copper from the support is read on a force gauge and is measured in pounds of force. This reading is doubled to obtain the peel strength per inch of width of laminate. A bond strength of 10 lbs./in. of width of laminate is deemed to be very acceptable. A bond strength of 12 lbs./in. or more is deemed to be exceptional.

Following the foregoing pretreatment steps, the copper foil is subjected to a third electrochemical treatment so as to deposit on the second electrodeposited copper layer a third, microcrystalline, copper and arsenic-containing electro-deposited layer.

The amount of copper deposited during this third treatment is limited so as to avoid undesirable powder and oxide transfer problems. Notwithstanding this fact, this last electrochemical treatment results in an extraordinary and wholly unexpected increase in bond strength over and above the amount of bond enhancement otherwise attainable with the same step through treatment on raw foil. Thus, the third electrochemical treatment provides an increase of as much as 3–4 lbs./in. of width of laminate up to about 14 lbs./in. of width of laminate. Such a 3–4 lbs./in. increase in bond strength would not be unusual in a conventional treatment process. What is unusual is that such an increase can be obtained without concomitant powder and oxide transfer problems and from a limited thickness deposit which normally would be expected to provide only half as much increase in bond strength.

Table A below shows the approximate desirable ranges of conditions for use in carrying out the process of the present invention (preferred ranges are set forth parenthetically).

TABLE A

| Condition | First Pretreatment Step | Second Pretreatment Step | Last Electrochemical Treatment |
|---|---|---|---|
| Cathode current density (ASF) | 100–300 (150–300) | 100–300 (150–250) | 50–200 (50–150) |
| Temperature (°F.) | 60–120 (70–100) | 90–160 (100–140) | 70–100 75–85) |
| Copper concentration (g/l, calc. as Cu) | 10–40 (20–30) | 40–120 (60–80) | 40–10 (4.5–5.5) |
| Acid concentration (g/l, calc. as $H_2SO_4$) | 30–100 (50–100) | 30–100 (50–100) | 30–100 (50–65) |
| Arsenic concentration (g/l, calc. as As) | .03–5 (.3–1.5) | — — | 0–.5 (.15–.3) |
| Circulation (fraction of total volume recirculated per minute) | 0–1/10 | 0–1/10 | 0–1/10 |
| Time (secs.) | 5–30 (10–14) | 5–30 (8–12) | 5–30 (8–12) |
| Cathode | copper foil | copper foil | copper foil |
| Anode | preferably insoluble lead | preferably insoluble lead | preferably insoluble lead |

As will be apparent to those skilled in the art, the particular conditions employed within a given one of the aforelisted ranges will be influenced by the condition employed within the others of said ranges. By way of example, the higher the copper concentration, the lower the temperature and the higher the cathode current density.

The degree of electrolyte circulation employed is that which is sufficient to maintain substantially homogeneous the electrolyte composition and temperature.

The electrodeposits resulting from each of the two pretreatments and the final treatment step will generally vary within the following approximate thickness ranges:

TABLE B

| | Thickness (g/m² of foil surface) |
|---|---|
| First Pretreatment Step | 4–12 (preferably 6) |
| Second Pretreatment Step | 4–12 (preferably 6) |
| Third Treatment Step | 1–4 (preferably 1½) |

While at least some of the advantages of the present invention will be obtained even if limits such as those in the third treatment step are exceeded, best results are obtained (viz., avoidance of powder and oxide transfer problems while obtaining significant bond enhancement) within the limits noted. Indeed, the greatest significance of the present invention is that these limits needn't be exceeded to achieve a major increase in bond strength.

Of critical importance in the practice of the present invention is the use of arsenic in the first pretreatment step. If no arsenic is employed in that step, the results of the first two pretreatment steps will be a plurality of copper electrodeposits on the copper foil which are sufficiently unreceptive to third electrochemical treatment so that a significant powder or oxide transfer problem will result. By including arsenic in the first pretreatment step, the two-step pretreatment results in a pretreated foil which is better suited (viz., is more receptive) to receipt of the final electrochemical treatment.

It is of interest to note that while arsenic is included in the first pretreatment electrodeposited copper layer, the amount deposited is small compared to the amount of arsenic in solution. This no doubt may be explained by the fact that arsenic has great difficulty co-depositing when copper concentration is as high as it is in the first pretreatment step.

Arsenic is included in a proportionately somewhat greater quantity in the final treatment electrodeposit. It is to be noted, however, that while best results are attained employing arsenic in the third treatment, advantages of the present invention (though diminished somewhat) are nevertheless attainable without its use.

The second pretreatment step is critical as well. If the final treatment were applied directly to the first treatment without an intermediate gilding layer, the resulting powder and oxide transfer problems would be both significant and unacceptable. By interposing a gilding layer between the two, this problem is avoided.

As previously noted, the increase in bond strength obtained from the final electrochemical treatment is not only extraordinary but is totally surprising. In order to obtain this type of increase in bond strength without the pretreatment, one would have to operate under electrolytic conditions such as to provide significant powder and oxide transfer problems. Attempts to eliminate these powder and oxide transfer problems without the pretreatment would result in loss of the significant increase in bond otherwise obtainable with it. What is truly astonishing is that the final electrochemical treatment employed in the present process can be operated to produce as small a copper deposit as was previously noted while obtaining the astounding bond improvement noted above.

The process of the present invention is preferably carried out in three separate treatment tanks as a series operation. In other words, copper foil is passed through the first tank and thereafter passed in sequence through second and third tanks. Alternatively (though not preferred), all three treatments can be carried out in a single tank with the draining of the tank between treatments, though this would preclude continuous operation.

The particular apparatus employed to apply each of the electrodeposited layers to the surface of the copper foil forms no part of the present invention. Such layers can, however, be conveniently applied by passing the copper foil through an electrolyte adjacent plate anodes with the copper foil passed in serpentine fashion in proximity to such anodes and, by appropriate contact between the copper foil and conducting rollers, the copper foil is made cathodic in the circuit. By passing the copper foil through such a system so that the surface of the foil to be coated faces the active face of the anodes, the metal to be coated on said surface will be electrodeposited thereon from the electrolyte. As will be appreciated, in order to carry out the preferred arrangement, the apparatus used will employ three separate treatment tanks.

As previously mentioned, it is within the contemplation of the present invention not only to provide a novel method for producing copper foil having good bond strength and copper foil produced thereby but to provide laminates comprised of said copper foil bonded to an appropriate substrate. As will be apparent, the particular substrate used in this laminate will vary depending upon the use for which the laminate is intended and the service conditions under which such laminate will be used. Particularly appropriate substrates which adapt the laminate for use in forming printed circuits include epoxy resin-impregnated fiberglass supports such as those previously noted, epoxy-impregnated paper, phenolic resin-impregnated paper and the like. Both flexible and non-flexible supports such as Teflon-impregnated fiberglass ("Teflon" is the trademark for polytetrafluoroethylene), Kel-F impregnated fiberglass ("Kel-F" is a trademark for certain fluorocarbon products including polymers of trifluorochloroethylene and certain copolymers) and the like are also usable. Other flexible substrates include polyimides such as those known under the designations "Kapton" and "H-Film" (both are manufactured by duPont and are polyimide resins produced by condensing a pyromellitic anhydride with an aromatic diamine).

The adhesives used to bond the treated copper foil to the substrate are those conventionally used for the specific application in question, "FEP" (a fluorinated ethylene propylene resin in the form of a copolymer of tetrafluoroethylene and hexafluoropropylene having properties similar to Teflon) being particularly appropriate for the Teflon and Kel-F and conventional epoxy resins being useful for the other materials. The method of bonding the copper foil to the substrate is conventional and forms no part of the present invention, typical details of such bonding being set forth for example in the U.S. Pat. No. 3,328,275 to Waterbury.

The following example further illustrates preferred operations within the scope of the present invention.

Example 1

In this example, copper layers are applied to foil in an electrolytic cell of the general type previously described. The foil is passed in continuous sequence through each of three tanks as noted.

A roll of 1 oz. copper foil is electrodeposited with a copper layer in a first treatment tank containing an aqueous electrolyte and utilizing the following conditions:

| | |
|---|---|
| Cathode current density (ASF) | 160 |
| Temperature (°F.) | 75 |
| copper concentration (g/l, calculated as Cu) | 30 |
| Acid concentration (g/l, calculated as $H_2SO_4$) | 60 |
| Arsenic concentration (obtained from arsenic acid, calculated as g/l of As) | 1.25 |
| Circulation (fraction of total volume recirculated/min.) | 3/50 |
| Time (sec.) | 12 |
| Cathode | copper foil |
| Anode | insoluble lead |

The copper foil so treated has on one of its surfaces a powdery copper electrodeposit. As a result of this treatment step, the treated foil has a bond strength of about 9½–10 lbs./in.

This foil is then treated in a second treatment tank containing an aqueous electrolyte to electrodeposit a gilding or locking copper layer over the previously applied nodular copper layer. This gilding or locking treatment is carried out utilizing the following conditions:

| | |
|---|---|
| Cathode current density (ASF) | 200 |
| Temperature (°F.) | 120 |
| Copper concentration (g/l, calculated as Cu) | 70 |
| Acid concentration (g/l, calculated as $H_2SO_4$) | 60 |
| Circulation (fraction of total vol. recirculated/min.) | 3/50 |
| Time (sec.) | 12 |
| Cathode | copper foil |
| Anode | insoluble lead |

The foil so treated has a bond strength of about 9–10 lbs./in.

The copper foil which has been subjected to the foregoing two pretreatment steps is then passed into a third treatment tank containing an aqueous electrolyte utilizing the following conditions:

| | |
|---|---|
| Cathode current density (ASF) | 60 |
| Temperature (°F.) | 80 |
| Copper concentration (g/l, calculated as Cu) | 5 |
| Acid concentration (g/l, calculated as $H_2SO_4$) | 60 |
| Arsenic (obtained from arsenic acid, calculated as g/l of As) | .25 |
| Circulation (fraction of total vol. recirculated/min.) | 3/50 |
| Time (sec.) | 12 |
| Cathode | copper foil |
| Anode | insoluble lead |

The foil so treated has a bond strength of about 14 lbs./in.

The copper foil used in the treatment process of the present invention is preferably electrolytically formed but may be formed by rolling techniques as well. The arsenic used in the first pretreatment step and in the final electrochemical treatment step is preferably used in its (+5) form as by adding arsenic acid or arsenic oxide to the electrolyte, though any acid soluble compounds of arsenic may be used for this purpose.

Best results are obtainable using arsenic as the additive in the first pretreatment step and in the final electrochemical treatment step. In lieu of arsenic, other additives may be employed. Preferred among these substitute additives is antimony, with bismuth, selenium and tellurium being less preferred.

In the preceding portion of the specification, a novel process has been described for treating copper foil to improve its bond strength. This process comprises two pretreatment steps and a third electrochemical treatment, the latter preferably involving the use of a copper and arsenic-containing electrolyte. While this three-step process constitutes the preferred embodiment of the present invention, advantages of the present invention are also attainable with another embodiment involving only the first and second pretreatment steps as the complete treatment applied to the foil. Such a two-step treatment provides an electrodeposit which not only enhances bond strength significantly but which is extremely dense and strong.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, all changes which come within the meaning and range of equivalency of the claims are therefore intended to be embraced therein.

We claim:

1. A process for improving the bond strength of copper foil through the electrochemical treatment of a surface thereof comprising subjecting said surface to a two-step electrochemical pretreatment prior to the application of said electrochemical treatment, the first step of said pretreatment comprising subjecting said surface to an arsenic and copper-containing electrolyte under conditions such as to electrolytically deposit thereon a first copper layer which increases the bond strength of the raw foil; the second step of said pretreatment comprising subjecting said surface to a copper-containing electrolyte under conditions such as to electrolytically deposit thereon a second copper layer which substantially conforms to the configuration of the first layer and reduces the powder transfer characteristics of said first layer; and then giving said pretreated foil an electrochemical treatment in which said surface is subjected to a copper-containing electrolyte under conditions such as to electrolytically deposit thereon a third, copper-containing, microcrystalline layer which further increases the bond strength of said foil.

2. A process as defined in claim 1 wherein said electrochemical treatment involves the use of an arsenic and copper-containing electrolyte.

3. A process as defined in claim 2 wherein the copper and arsenic content in the electrolyte in said first step and in said electrochemical treatment are approximately as follows:

| | 1st Step | Electrochemical Treatment |
|---|---|---|
| Cu(g/l) | 10–40 | 4–10 |
| As(g/l) | .03–5 | 0–.5. |

4. A process as defined in claim 2 wherein the copper and arsenic content in the electrolyte in said first step and in said electrochemical treatment are approximately as follows:

| | 1st Step | Electrochemical Treatment |
|---|---|---|
| Cu(g/l) | 10–40 | 4–10 |
| As(g/l) | .3–1.5 | 0–.5. |

5. A process as defined in claim 2 wherein a sufficient amount of arsenic is present in the electrolyte in said first step of said pretreatment to increase the bond strength resulting from said electrochemical treatment over what it would have been had said electrochemical treatment been applied to foil which had not been pretreated.

6. A process as defined in claim 1 wherein approximately 1–4 grams of electrodeposit per square meter of foil surface is deposited during said electrochemical treatment.

7. A process for improving the bond strength of copper foil comprising subjecting a surface of said foil to three electrochemical treatments such as to electrodeposit thereon three copper layers, said three treatments being carried out approximately under the following conditions:

| | Treatment No. 1 | Treatment No. 2 | Treatment No. 3 |
|---|---|---|---|
| Cu(g/l) | 10–40 | 40–120 | 4–10 |
| $H_2SO_4$ (g/l) | 30–100 | 30–100 | 30–100 |
| As (g/l) | .03–5 | — | 0–.5 |
| Electrolyte Temperature (°F.) | 60–120 | 90–160 | 70–100 |
| Deposition time (sec.) | 5–30 | 5–30 | 5–30 |
| Cathode current density (ASF). | 100–300 | 100–300 | 50–200 |

8. A process as defined in claim 7 wherein the conditions for said three treatments are approximately as follows:

| | Treatment No. 1 | Treatment No. 2 | Treatment No. 3 |
|---|---|---|---|
| Cu (g/l) | 20–30 | 60–80 | 4.5–5.5 |
| $H_2SO_4$ (g/l) | 50–100 | 50–100 | 50–65 |
| As (g/l) | .3–1.5 | — | .15–.3 |
| Electrolyte Temperature (°F.) | 70–100 | 100–140 | 75–85 |
| Deposition Time (secs.) | 10–14 | 8–12 | 8–12 |
| Cathode current Density (ASF). | 150–300 | 150–250 | 50–150 |

9. A process as defined in claim 7 wherein the conditions for said three treatments are approximately as follows:

| | Treatment No. 1 | Treatment No. 2 | Treatment No. 3 |
|---|---|---|---|
| Cu (g/l) | 30 | 70 | 5 |
| $H_2SO_4$ (g/l) | 60 | 60 | 60 |
| As (g/l) | 1.25 | — | .25 |
| Electrolyte Temperature (°F.) | 75° | 120 | 80 |
| Deposition Time (secs.) | 12 | 12 | 12 |
| Cathode Current Density (ASF). | 160 | 200 | 60 |

10. A process for improving the bond strength of copper foil through the electrochemical treatment of a surface thereof comprising subjecting said surface to a two-step electrochemical treatment, the first step of said treatment comprising subjecting said surface to an arsenic and copper-containing electrolyte under conditions such as to electrolytically deposit thereon a first copper layer which increases the bond strength of the raw foil; the second step of said treatment comprising subjecting said surface to a copper-containing electrolyte under conditions such as to electrolytically deposit thereon a second copper layer which substantially conforms to the configuration of the first layer and reduces the powder transfer characteristics of said first layer.

11. The product of the process of claim 1.

12. The product of the process of claim 6.

13. The product of the process of claim 2.

14. The product of the process of claim 3.

15. The product of the process of claim 4.

16. The product of the process of claim 5.

17. The product of the process of claim 7.

18. The product of the process of claim 8.

19. The product of the process of claim 9.

20. The product of the process of claim 10.

21. Copper foil having on a face thereof three electrodeposited superposed layers, the layer closest to said face containing arsenic and copper, the intermediate layer being a copper electrodeposit which substantially conforms to the configuration of said closest layer and serves to reduce the powder transfer characteristics of said closest layer; the third outermost layer being copper-containing and microcrystalline, said third layer increasing the bond strength of said foil over and above the bond strength provided by said closest and intermediate layers.

22. Copper foil as defined in claim 21 wherein said third outermost layer is copper-arsenic.

23. A printed circuit board comprised of a dielectric substrate bonded to which is the copper foil of claim 21, the portion of said foil being closest to said substrate being said third layer.

24. A printed circuit board comprised of a dielectric substrate bonded to which is the copper foil of claim 22, the portion of said foil being closest to said substrate being said third layer.

* * * * *